(12) United States Patent
Severson et al.

(10) Patent No.: US 7,279,926 B2
(45) Date of Patent: Oct. 9, 2007

(54) HEADSWITCH AND FOOTSWITCH CIRCUITRY FOR POWER MANAGEMENT

(75) Inventors: Matthew Levi Severson, Oceanside, CA (US); Chih-tung Chen, San Diego, CA (US); Geoffrey Shippee, La Jolla, CA (US); Sorin Dobre, San Diego, CA (US)

(73) Assignee: Qualcomm Incoporated, San Diego ( * ) Notice: Subject to any disclaimer, the term of this patent is extended or adjusted under 35 U.S.C. 154(b) by 136 days.

(21) Appl. No.: 10/856,526

(22) Filed: May 27, 2004

(65) Prior Publication Data

US 2005/0276132 A1    Dec. 15, 2005

(51) Int. Cl.
H03K 19/23 (2006.01)
(52) U.S. Cl. .......................... 326/33; 326/83; 326/81; 257/391; 257/206; 257/207; 257/392; 257/393; 257/401; 716/14; 716/18
(58) Field of Classification Search ............... 326/81, 326/83, 33
See application file for complete search history.

(56) References Cited

U.S. PATENT DOCUMENTS 5,926,034 A    7/1999    Seyyedy

| | | | |
|---|---|---|---|
| 6,516,447 B2* | 2/2003 | Wadland et al. | 716/1 |
| 6,653,693 B1* | 11/2003 | Makino | 257/391 |
| 6,900,478 B2* | 5/2005 | Miyagi | 257/202 |
| 2003/0094661 A1* | 5/2003 | Miyagi | 257/391 |
| 2003/0112042 A1 | 6/2003 | Takahashi | |
| 2003/0218478 A1* | 11/2003 | Sani et al. | 326/33 |
| 2004/0026751 A1* | 2/2004 | Makino | 257/391 |

\* cited by examiner

*Primary Examiner*—Vibol Tan
(74) *Attorney, Agent, or Firm*—George C. Pappas; Larry J. Moskowitz; Thomas Rouse

(57) ABSTRACT

In general, this disclosure is directed to circuitry for implementation of headswitches and footswitches in an ASIC for power management. The disclosed circuitry supports not only effective power management, but also efficient use of ASIC area, reduced complexity, and the use of electronic design automation (EDA) tools. In this manner, the disclosed circuitry can support enhanced performance and simplified ASIC design. In some cases, headswitch or footswitch circuitry may be implemented as a switch pad ring that extends around a hard macro forming part of an ASIC core. In other cases, headswitch or footswitch circuitry can be distributed within an ASIC core by embedding distributed headswitch or footswitch components under metal layer power routing coupled to standard cell rows.

46 Claims, 8 Drawing Sheets

HEADSWITCH AND FOOTSWITCH CIRCUITRY FOR POWER MANAGEMENT

RELATED APPLICATIONS

The following U.S. patent application is related to this application: "REGULATION OF CROWBAR CURRENT IN CIRCUITS EMPLOYING FOOTSWITCHES/HEADSWITCHES," U.S. patent application Ser. No. 10/155,956, U.S. Publication Number US-2003-0218478-A"

TECHNICAL FIELD

The disclosure relates to integrated circuits and, more particularly, to headswitches and footswitches used in power management for integrated circuits.

BACKGROUND

Electronic devices incorporating integrated circuits, such as application specific integrated circuits (ASICs), often employ power saving techniques to reduce power consumption and thereby achieve extended battery life. Small, portable devices such as mobile telephones and personal digital assistants (PDAs), for example, typically incorporate circuitry for implementing inactive modes to limit power consumption by logic circuitry. Inactive modes may include stand-by, low power and sleep modes.

Power dissipation in digital circuits, and more specifically in Complementary Metal Oxide Semiconductor (CMOS) circuits, is approximately proportional to the square of the supply voltage. Therefore, the most effective way to achieve low-power performance is to scale down the supply voltage. CMOS circuits on ASICs are capable of operating at significantly reduced power levels. In order to avoid increases in propagation delay, however, the threshold voltage of the CMOS devices also is reduced.

The reduction in threshold voltage generally causes an increase in stand-by current due to changes in the sub-threshold leakage current of the Metal Oxide Semiconductor (MOS) devices. The leakage current that flows through an "off" transistor tends to increase exponentially as the threshold voltage of a device is reduced. Therefore, electronic devices such as mobile telephones and PDAs that remain in an inactive mode for an extended period of time can exhibit significant leakage current, and cause undesirable drain on battery power during the inactive mode.

In order to reduce leakage current during stand-by modes, some ASICs include headswitches or footswitches that are electrically connected between the low voltage threshold (LVT) logic gates of a CMOS circuit and the power rail or ground rail. A headswitch is a high voltage threshold (HVT) Positive Channel Metal Oxide Semiconductor transistor that stands between the local power mesh routing of an ASIC core or block and the top-level power mesh routing. A footswitch is an HVT NMOS transistor that stands between the local ground mesh routing and the top-level ground rail/mesh.

During an inactive mode, the headswitches or footswitches are turned off to disconnect the LVT logic gates from the power/ground supply and thereby "collapse" the power rail. Because the headswitch or footswitch has a high threshold voltage, the amount of leakage current drawn from the power supply by the headswitch or footswitch is substantially reduced relative to the leakage current that would otherwise flow through the LVT logic gates. During an active mode, the headswitches or footswitches are turned on to connect the power supply and ground to the LVT gates. Therefore, during an active mode, the LVT logic gates are powered by substantially the same voltage as if they were directly connected to the power supply and ground.

Unfortunately, the implementation of headswitch or footswitch circuitry on a global basis to collapse the power rail for a large array of logic cells can be very complicated. Existing approaches have relied on special routing and custom analysis and design tools. Numerous issues, including extra power routing to feed the headswitches and footswitches, significant area overhead, unmanageable IR voltage drops, signal routing accommodations, complications to standard tool flow and methodology, and the use of feedthroughs, further compound the complexity of existing headswitch and footswitch implementations.

SUMMARY

In general, this disclosure is directed to circuitry for implementation of headswitches and footswitches in an integrated circuit such as an ASIC for power management. The disclosed circuitry supports not only effective power management, but also efficient use of integrated circuit area, reduced complexity, and the use of electronic design automation (EDA) tools. In this manner, the disclosed circuitry can support enhanced performance and simplified ASIC design.

In some embodiments, headswitch or footswitch circuitry may be implemented as a switch pad ring that extends around a hard macro forming part of an ASIC core. In other embodiments, headswitch or footswitch circuitry can be distributed within an ASIC core by embedding headswitch or footswitch components under Metal 2 (M2) layer power routing coupled to standard logic cell rows.

The circuitry described in this disclosure may be applicable to a variety of electronic devices, but may be especially useful in small, portable wireless communication devices that rely on inactive circuit modes to conserve battery power.

In one embodiment, the disclosure is directed to an integrated circuit comprising a logic circuit including a plurality of logic cells, and a pad ring placed around the logic circuit. An external terminal provides a first supply potential, and an internal terminal provides a second supply potential. Each of a plurality of switch cells, within the pad ring, electrically couples the external terminal to the internal terminal to selectively apply the second supply potential to the logic cells within the logic circuit. The switch cells may include headswitches or footswitches. In addition, feedthrough cells may be provided in the logic circuit to selectively drive the switch cells.

In another embodiment, the disclosure is directed to an integrated circuit comprising, a logic circuit including a plurality of logic cells, a metal 2 layer power rail disposed over the logic cells area, and a metal 2 layer ground rail disposed over the logic cells area. Each of a plurality of switch cells, under the metal 2 layer, selectively couples and decouples one of the power rail and the ground rail to power at least some of the logic cells. The switch cells may include headswitches or footswitches, and may be driven by feedthrough cells within the logic circuit.

The details of one or more embodiments are set forth in the accompanying drawings and the description below. Other features, objects and advantages will become apparent from the description and drawings, and from the claims.

DETAILED DESCRIPTION

Figure 1:
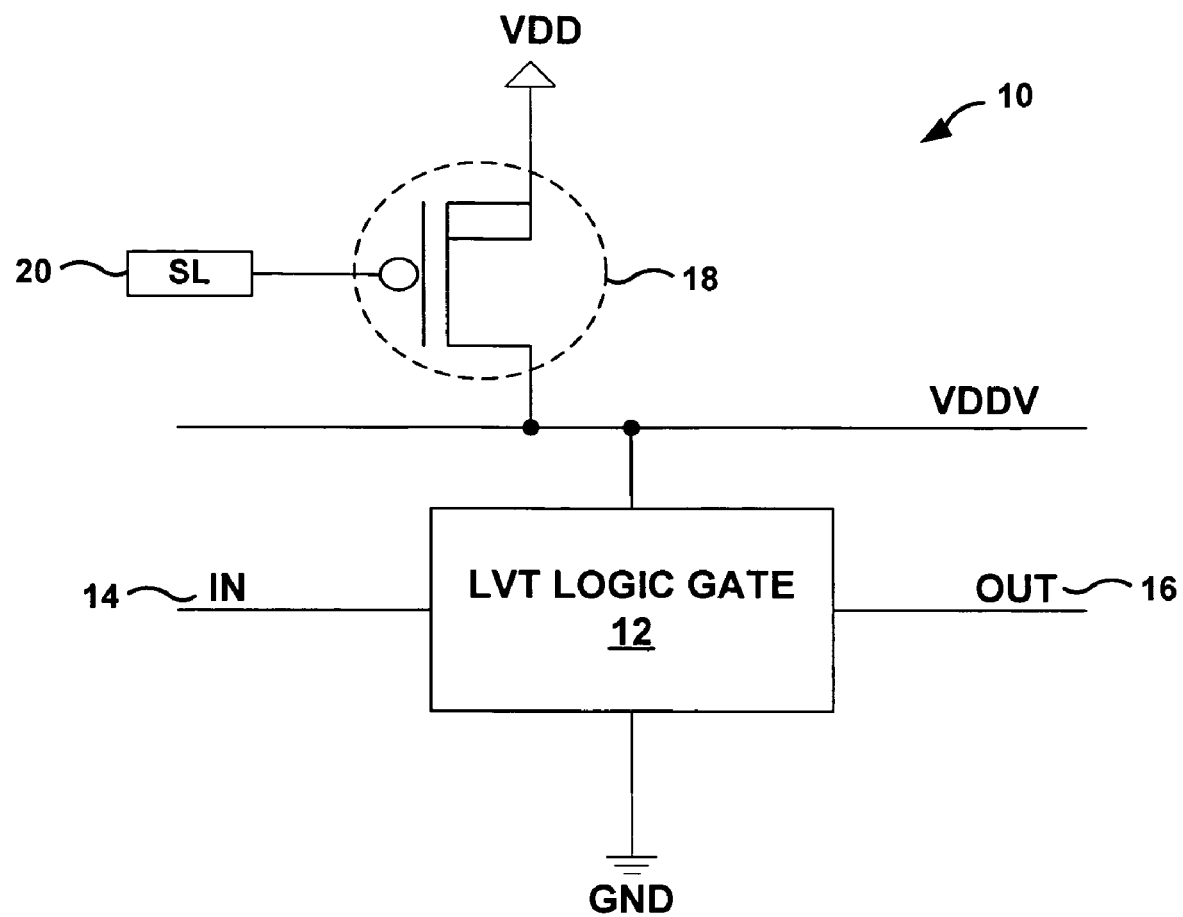
FIG. 1 is a circuit diagram illustrating a multi-threshold CMOS (MTCMOS) circuit with a headswitch.

FIG. 1 is a circuit diagram illustrating a multi-threshold CMOS (MTCMOS) circuit 10 with a headswitch 12. Circuit 10 forms part of a logic circuit in an integrated circuit such as an ASIC. Circuit 10 is configured to reduce the amount of leakage current in logic gates with reduced supply and threshold voltages. Hence, circuit 10 may be particularly useful in circuits such as ASICs, which incorporate a large array of low voltage threshold (LVT) logic gates. In the example of FIG. 1, an LVT logic gate 12 is electrically coupled to a "virtual" voltage supply node VDDV and an actual ground potential GND. An input signal (IN) 16 drives logic gate 12, which then produces an output signal (OUT) 18.

A headswitch 18 electrically couples "virtual" voltage supply node VDDV to the global voltage supply VDD. Voltage supply VDD is provided from an external terminal that is external to circuitry incorporating logic gate 12. Similarly, ground GND is provided by an external ground terminal. Headswitch 18 is a high voltage threshold (HVT) or ultra high voltage threshold (UHVT) PMOS transistor. A gate input 20 selectively applies a sleep signal (SL) to headswitch 18, causing the headswitch to switch on/off and to electrically couple and decouple the actual voltage supply VDD node to and from the "virtual" voltage supply node VDDV, thereby placing LVT logic gate 12 in active and inactive modes. Actual voltage supply VDD and actual ground GND of MTCMOS circuit 10 may be provided by a battery. For example, in a mobile phone, VDD and GND have a voltage difference between 0.5 and 2.0 volts.

LVT logic gate 12 may comprise any type of logic gates in any configuration. For example, logic gates may comprise a single CMOS inverter or may also comprise any number and combination of low voltage threshold AND, NAND, OR, NOR, XOR, or other types of static/dynamic logic gates or memories. The high voltage threshold transistor forming headswitch 18 selectively applies the actual voltage supply VDD, less a voltage drop across the headswitch transistor, to the virtual voltage supply rail VDDV to power LVT logic gate 12 during a normal operating mode, i.e., an active mode. Conversely, during an inactive mode, headswitch 18 decouples actual voltage supply VDD from the virtual voltage supply rail VDDV, thereby collapsing the power supply rail. Hence, the output of headswitch 18, and thus the voltage on VDDV, is substantially equal to VDD when the SL signal at gate input 20 is de-asserted, i.e., SL 14 is low.

During a sleep or stand-by mode, sleep signal SL at gate input 20 is de-asserted to cause headswitch 18 to turn off. The amount of leakage current drawn from VDD in an inactive mode is reduced because headswitch 18 has a high threshold voltage and there is no current flowing through LVT logic gate 12. In contrast, if headswitch 18 were not used during an inactive mode, LVT logic gate 12 would be electrically connected across the actual supply voltage VDD and actual ground reference GND, and generate an undesirable amount of leakage current during the inactive mode.

Likewise, during an active mode, sleep signal SL is asserted at gate input 20, causing headswitch 18 to turn on and couple voltage supply VDD to virtual voltage supply VDDV, thereby powering LVT logic gate 12 for normal operation in an active mode. Therefore, during an active mode, LVT logic gate 12 of exemplary MTCMOS circuit 10 is powered by substantially the same voltage as if it were directly connected to VDD and GND. Thus, exemplary MTCMOS circuit 10 allows the threshold voltage of LVT logic gate 12 to be lowered while reducing the amount of leakage current during inactive modes.

Figure 2:
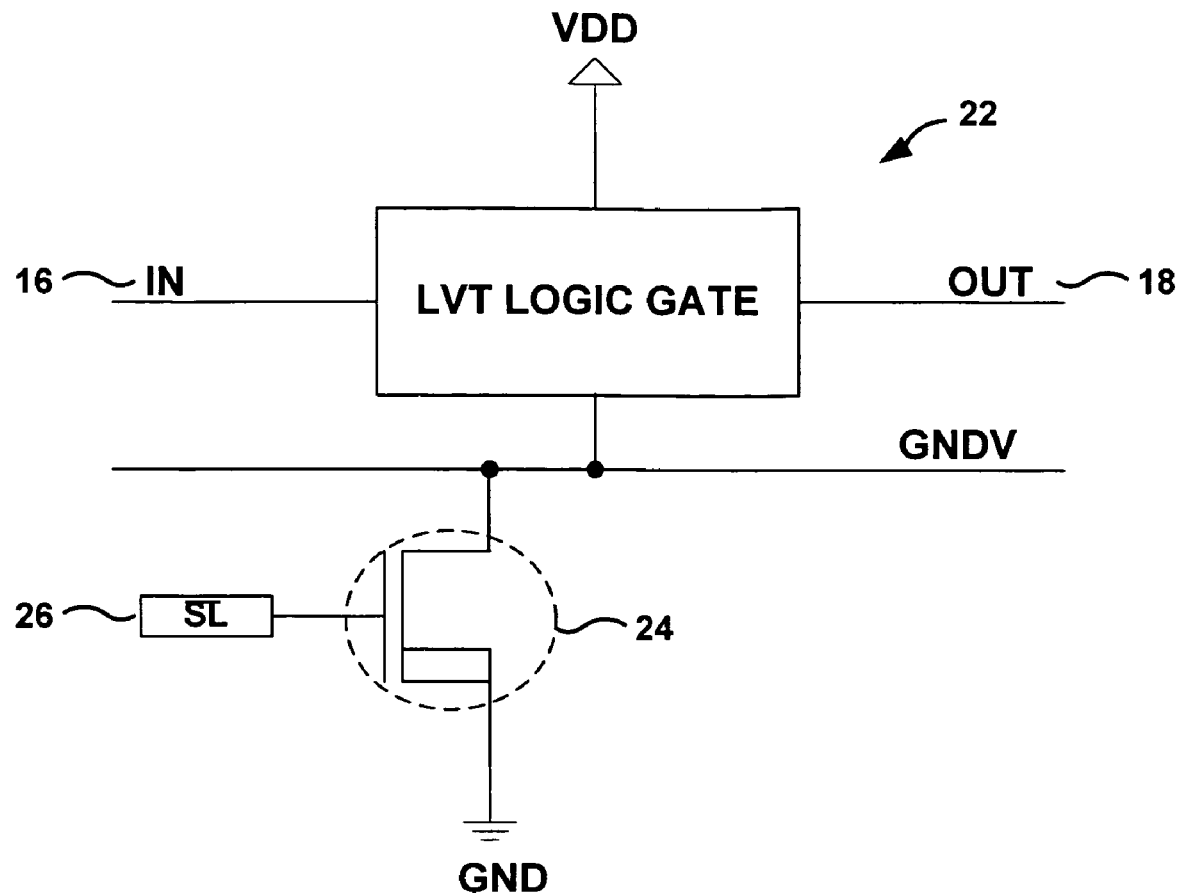
FIG. 2 is a circuit diagram illustrating a multi-threshold CMOS (MTCMOS) circuit with a footswitch.

FIG. 2 is a circuit diagram illustrating a multi-threshold CMOS (MTCMOS) circuit 22 with a footswitch 24. Circuit 22 substantially conforms to circuit 10 of FIG. 1, but incorporates footswitch 24 instead of headswitch 18. As shown in FIG. 2, LVT logic gate 4 of MTCMOS circuit 22 is electrically coupled to the actual voltage supply VDD provided by an external power rail. However, LVT logic gate 4 is coupled to the virtual ground node GNDV, instead of actual ground node GND. Footswitch 24 includes a high voltage threshold (HVT) transistor that selectively connects and disconnects the virtual ground node GNDV to actual ground node GND depending on the operating mode of LVT logic gate 12, i.e., depending on whether the logic gate is in an active or inactive mode.

Input gate 26 applies a sleep signal SL to footswitch 24 to turn the footswitch on and off and thereby couple and decouple actual ground GND to and from virtual ground GNDV. When footswitch 24 is turned on and, in effect, "closed," virtual ground node GNDV is connected to the potential of actual ground node GND, less a voltage drop across footswitch 24. As with headswitch 18 of circuit 10 (FIG. 1), footswitch 24 permits LVT logic gate 12 to be powered by substantially the same voltage as if it were directly connected to actual ground GND in an active mode, but does not allow current to flow across the LVT logic gate in an inactive mode, thereby reducing leakage current.

Although the use of headswitch 18 or footswitch 24, or both in combination, can be effective in reducing leakage current in an integrated circuit such as an ASIC incorporating LVT logic circuitry, this approach can create a number of complications. In particular, the implementation of a headswitch or footswitch to collapse the power rail on a global basis, i.e., to a large array of LVT logic gates, cells or blocks, can be very complicated. For example, existing headswitch and footswitch implementations typically rely on special routing to selectively couple the voltage supply rail or ground potential rail to the individual LVT logic gates.

Existing headswitch and footswitch implementations, and associated routing complexities, can complicate layout and require the use of customized circuit analysis and simulation tools. Extra power routing to feed the headswitches and footswitches, and area overhead created by the routing and the headswitch/footswitch circuitry, further contribute to complexity. Additional issues that generally must be resolved in circuit design and layout include additional IR voltage drops, signal routing, complications to standard tool flow and methodology, and the use of feedthroughs. This disclosure describes headswitch and footswitch implementations that may be designed to alleviate some of the above problems.

Figure 3:
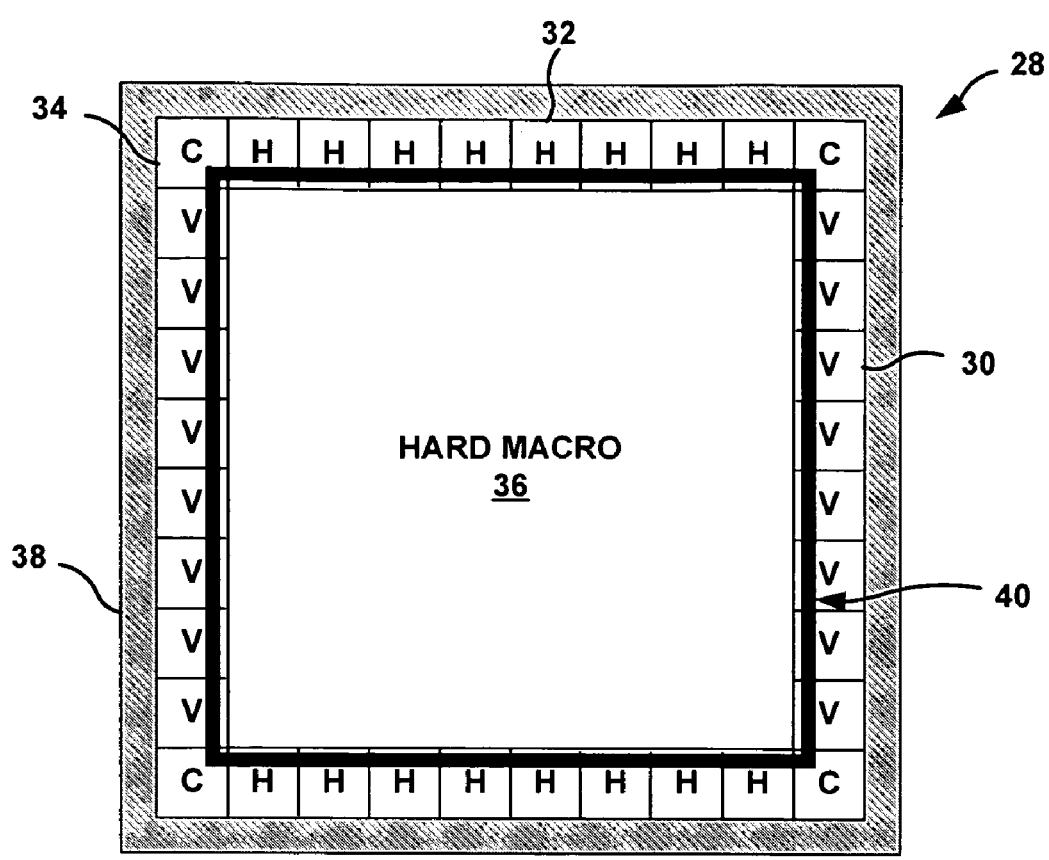
FIG. 3 is a layout diagram illustrating a switch pad ring comprising vertical, horizontal, and corner headswitches or footswitches disposed around the periphery of a hard macro core in an integrated circuit.

FIG. 3 is a layout diagram illustrating a switch pad ring 28 including vertical, horizontal, and corner switch cells 30, 32, 34 disposed around the periphery of a hard macro core 36 in an integrated circuit such as an ASIC. Switch pad ring 28 is disposed about hard macro core 36 in a manner similar to a conventional pad ring for coupling wire bonding pads of an ASIC tile to IC package pins. In the example of FIG. 3, however, switch pad ring 28 provides global power management for LVT logic gates within an integrated circuit, particularly in a circuit with a low supply voltage. Switch cells 30, 32, 34 may be headswitches or footswitches. Switch pad ring 28 represents an alternative implementation of a global headswitch or footswitch circuitry.

The implementation of switch pad ring 28 can provide simplified layout and routing, and facilitate the use of circuit analysis and simulation tools provided in existing EDA systems. In addition, switch pad ring 28 may promote more efficient area usage and reduced complexity. Although FIG. 3 depicts a relatively small number of switch cells 30, 32, 34 for ease of illustration, in practice, several hundred or thousand switch cells may be used depending on the size and density of an ASIC core to which the global headswitch or footswitch implementation is applied.

Vertical, horizontal and corner switch cells 30, 32, 34 within switch pad ring 28 aid in power management of an integrated circuit such as an ASIC by reducing the amount of leakage current during inactive modes. In particular, switch pad ring 28, in effect, decouples LVT logic gates within the hard macro core 36 on a selective basis to avoid flow of leakage current during sleep or stand-by modes. Switch pad ring 28 includes a number of different switch cells 30, 32, 34 configured to permit an area or block of an ASIC to be powered on and off independently of other areas of the ASIC.

An ASIC may be part of a battery operated portable electronic device. Switch pad ring 28 may be particularly advantageous in portable electronic devices such as a mobile phone, personal digital assistant (PDA), or other such devices with a sleep or stand-by mode in which part of the ASIC continues to operate while some of the circuits are turned off or are in a low power state. For example, switch pad ring 28 may allow a digital signal processor (DSP) of a mobile phone to be turned off while different circuitry of the ASIC monitors the power of received signals for an indication of an incoming call.

As shown in FIG. 3, switch pad ring 28 comprises vertical (V) switch cells 30 oriented along a vertical extent of the pad ring, horizontal (H) switch cells 32 oriented along a horizontal extent of the pad ring, and corner (C) switch cells 34 that bridge the corner spaces between vertical and horizontal switch cells. In some embodiments, spacer cells may be positioned between some adjacent switch pad ring cells 30, 32, 34. Physically, and for EDA purposes, switch pad ring cells 30, 32, 34 are arranged around a hard macro core 36.

Hard macro core 36 defines a hardened core of LVT logic gates and associated power and signal routing circuitry, for purposes of EDA-based designed tools such as VHSIC (Very High Speed Integrated Circuits) Hardware Description Language (VHDL), Verilog or the like.

Each switch cell 30, 32, 34 includes a headswitch or footswitch, substantially as shown in FIGS. 1 and 2, respectively, to decouple circuitry within hard macro core 36 from an external terminal in the form of external power ring 38 during inactive modes. External power ring 38 supplies the actual voltage supply (VDD) terminal, or "rail," from power supply circuitry within the ASIC. Switch cells 30, 32, 34 may comprise headswitches or footswitches, although headswitches will be generally described herein for purposes of illustration.

An internal terminal in the form of internal power ring 40 serves as the virtual voltage supply (VDDV) terminal, or "rail," for components inside hard macro 36. Hence, hard macro 36 is supplied by internal power ring 40 while external power ring 38 is tapped from an external supply voltage of the ASIC. The LVT logic gates in hard macro core 36 may form standard cells that can be adapted into larger, functional blocks. For example, hard macro core 36 may comprise memory blocks, digital signal processor (DSP) circuitry, custom processor cores, or any other hardened intellectual property (IP) cores.

When switch pad ring 28 is implemented with headswitches or footswitches with triple well isolation, i.e., a deep N-well, the standard cells used to implement hard macro 36 may have local substrate connections. However, when switch pad ring 28 is implemented with footswitches, the standard cells used to implement hard macro 36 may have floating substrate connections.

Advantageously, switch pad ring 28 may appear as a standard cell forming part of hard macro core 36, but with an additional on/off signal, to EDA placement and routing tools at the next level of the ASIC design hierarchy. Hard macro core 36 pins may be physically placed outside switch pad ring 28 but inside the EDA boundary of the hard macro core 36. As a result, timing closure can be simplified at the top hierarchy level of the design process. Additionally, the placement of switch cells 30, 32, 34 can be fully automated and switch pad ring 28 can be conveniently tiled around hard macro core 36. Therefore, even with the incorporation of headswitches or footswitches, the design of an ASIC or other integrated circuit is simplified and the workload of the designer is reduced by the global implementations represented by switch pad ring 28.

Figure 9:
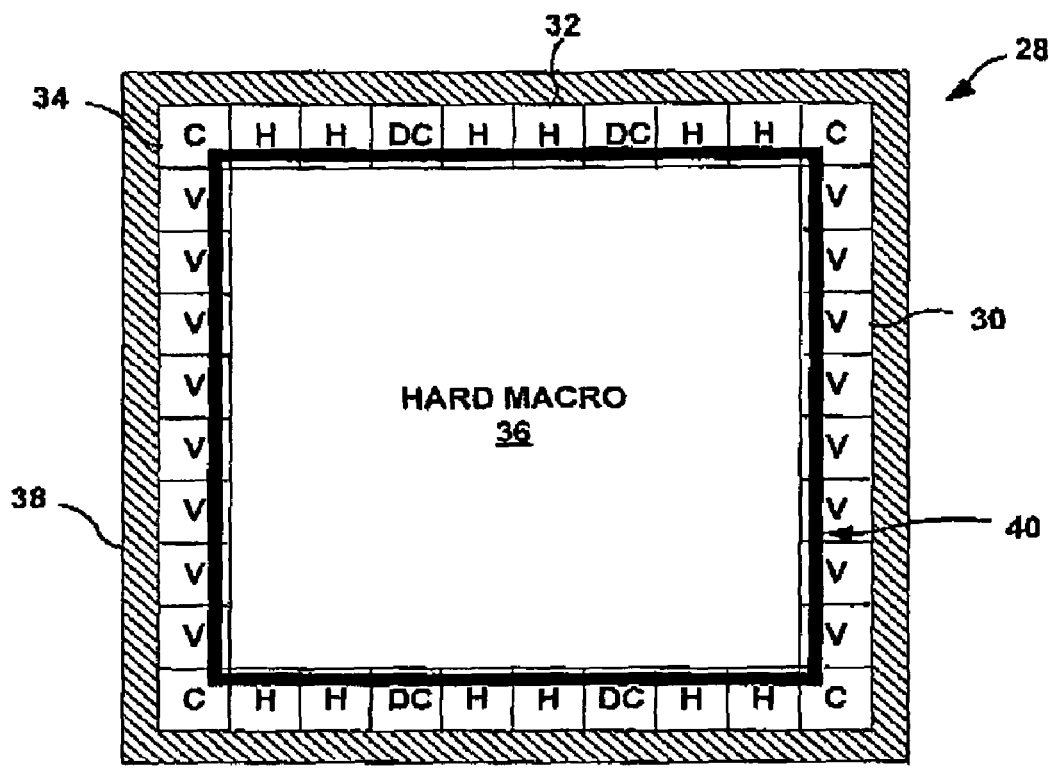
FIG. 9 is a layout diagram illustrating a switch pad ring as shown in FIG. 3 but with several of the horizontal switch cells being replaced with decoupling capacitor cells.

Switch pad ring 28 also makes efficient use of area by using available area for decoupling capacitors, as needed, and minimizing power routing. In particular, the area under metal 2 (M2) power routes can be used for switch cells 30, 32, 34 or decoupling capacitors. In some embodiments, some of the switch cells 30, 32, 34 may be replaced with decoupling capacitor cells if applicable IR drop requirements of the ASIC are not met. For example. FIG. 9 shows an embodiment of a switch pad ring 28' in which some of the horizontal headswitches 32 are replaced with decoupling capacitor cells DC. Additionally, no extra routing is required inside switch pad ring 28 in embodiments which use headswitches to implement switch cells 30, 32, 34.

For example, switch pad ring 28 may be tiled around hard macro core 36 using standard VLSI design tools and services by generating an initial netlist, inserting feedthrough cells and headswitches and connecting enable signals properly for the floor plan of an ASIC or system on a chip (SOC).

Designers supply a configuration file including the number of headswitches for vertical, horizontal, and corner switch pad ring cells based on initial size, power and ground specifications for hard macro core 36. Additionally, as mentioned above, extra headswitches can be replaced with decoupling capacitance devices if IR drop analysis reveals that excess headswitches are inserted.

Figure 4:
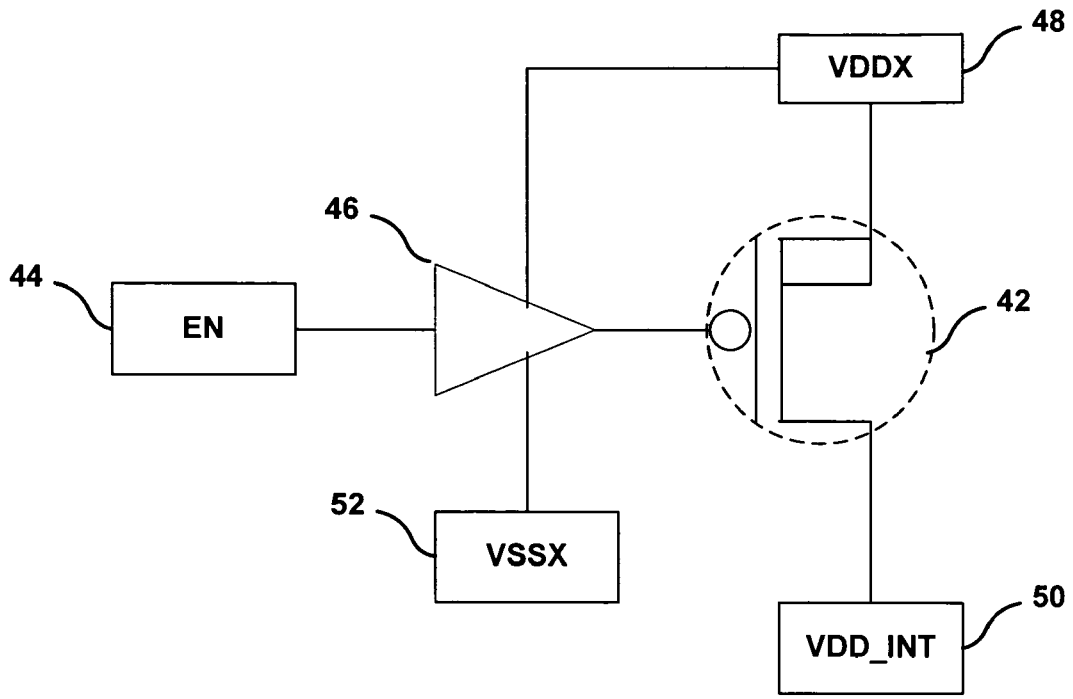
FIG. 4 is a circuit diagram illustrating an exemplary headswitch which can be used to implement vertical, horizontal, and corner cells of the switch pad ring in FIG. 3.

FIG. 4 is a circuit diagram illustrating an exemplary headswitch 42 which is used to implement vertical, horizontal, and corner switch pad ring cells 30, 32, 34 of the switch pad ring 28 in FIG. 3. Headswitch 42 is a high voltage threshold PMOS transistor which is controlled by high asserted sleep signal EN at gate input 44 through a feedthrough cell 46. Actual supply voltage VDDX 48 from external power ring 38 (FIG. 3) is also electrically connected to headswitch 42.

The output of headswitch 42, VDD_INT 50, is electrically connected to internal power ring 40 (FIG. 3). Hence, VDD_INT 50 functions as the virtual voltage supply for components within hard macro 36. As shown in FIG. 4, feed through cell 46 is electrically connected to VDDX 48 and ground supply VSSX 52. Feed through cell 46 supplies sufficient gate-source voltage ($V_{gs}$) of headswitch 42 to turn the high threshold voltage PMOS transistor on and off in response to the state of sleep signal EN at gate input 44. Feedthrough cell 46 also may be configured to optimize the ON time for headswitch 42.

The size of a headswitch 42 is generally constrained by the maximum voltage drop across it during high current loads when external power ring 38 is connected to internal power ring 40 across the headswitch. Headswitch 42 preferably is used in each of vertical, horizontal, and corner switch pad ring cells 30, 32, 34, although the maximum voltage drop, and thus the size of each respective switch pad ring cell may be different. In one particular embodiment, for example, the respective areas for vertical, horizontal and corner switch cells 30, 32, 34 may be approximately 252 square microns (42 microns by 6 microns), 381 square microns (17.4 by 21.9 microns), and 919.8 microns (42 microns by 21.9 microns), respectively.

Feedthrough cells 46 within hard macro 36 may have a power pin, referred to as SVDDX, which is electrically connected to external power ring 38. External power ring 38 is routed wide to the SVDDX pin. Consequently, the pin electrically coupled to external power ring 38 is also wide. Such a feedthrough cell 46 also has pins electrically connected to VDDX 32 and VSSX 38. However, inside feedthrough cell 46, only SVDDX may be used and additional power routing is not required.

Advantageously, feedthrough cell 46 may appear as a standard logic cell within hard macro core 36, yet include the connection to the external power ring 38 as described above. In particular, feedthrough cell 46 may include pins coupled to virtual power or ground terminals, like other standard logic cells, but further include an additional set of pins coupled to external power and ground terminals. Even though feedthrough cell 46 includes the virtual power and ground connections, so as to appear as a standard logic cell, it actually operates using the external power and ground connections. In this manner, feedthrough cell 46 can operate during an inactive mode when other logic cells are turned off and do not receive external power, and thereby be used to drive headswitches or footswitches in the switch pad ring 28.

During an inactive mode, EN at gate input 44 is de-asserted to cause headswitch 42 to turn off, and thereby decouple VDDX 48 from VDD_INT 50. Because headswitch 42 has a high threshold voltage, the amount of leakage current drawn from VDDX 48 by LVT logic gates within hard macro core 36 is reduced. In contrast, if headswitch 42 were not used during an inactive mode, hard macro core 36 would be electrically connected to VDDX 48 and VSSX 52.

Conversely, during an active mode, signal EN at gate input 44 is asserted to cause headswitch 42 to turn on so as to supply VDDX 48 to VDD_INT 50 and thereby power the LVT logic gates within hard macro 36. Therefore, during an active mode, hard macro core 36 is powered by substantially the same voltage as if hard macro core 36 was directly connected to VDDX 48 and VSSX 52. Consequently, headswitch 42 allows the threshold voltage of the LVT logic gates within hard macro 36 to be lowered while reducing the amount of leakage current during low power modes. At the same time, however, the switch pad ring implementation depicted in FIG. 3 reduces the complications associated with many existing headswitch and footswitch implementations for global power management.

The voltage drop across headswitch 42 is minimal when the headswitch is on, and the EN signal at gate input 44 is ramped up over time so as not to substantially affect other circuits running off of VDDX 48. At initial power-on, all headswitches 42 may be on by default. However, only the required headswitches for a warm boot will be on by default after a power reset, i.e., warm boot. Following a warm boot, software can then program registers to turn on the switch cells in pad ring 28 to establish necessary power rails and reset the switch pad ring.

In some embodiments, circuit 10 (FIG. 1) may include a plurality of pad rings for various hard macro cores. In those cases, the individual switch pad rings may be independently reset as needed to power up different operations or applications. In this manner, the overhead for power up after a power collapse can be optimized. Also, a buffer network for the switch cells in each pad ring can be designed so that it supplies enough drive current to drive the gate of the large headswitches while also optimizing the on time of the headswitches.

Figure 5:
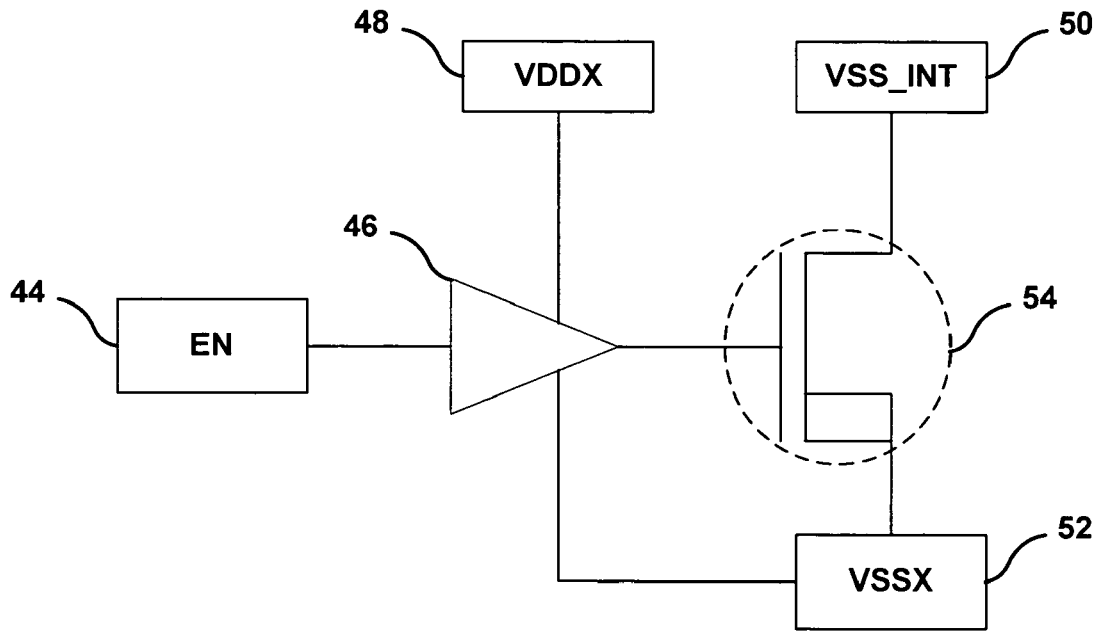
FIG. 5 is a circuit diagram illustrating an exemplary footswitch which can be used to implement the vertical, horizontal, and corner cells of the switch pad ring in FIG. 3.

FIG. 5 is a circuit diagram illustrating an exemplary footswitch 54 which can be used to implement vertical, horizontal, and corner switch pad ring cells 30, 32, 34 of the switch pad ring 28 in FIG. 3. In the example of FIG. 5, footswitch 54 is a high voltage threshold NMOS transistor which is controlled by low asserted sleep signal EN 47 through feedthrough cell 46. Ground supply VSSX 52 from external power ring 38 (FIG. 3) is electrically connected to footswitch 54, and the drain output of the footswitch, VSS_INT 50, is electrically connected to internal power ring 40 (FIG. 3).

Feed through cell 46 supplies a sufficient gate-source voltage ($V_{gs}$) to bias footswitch 54 on, and is electrically connected to VDDX 48 and ground supply VSSX 52. Feedthrough cell 46 of FIG. 5 may additionally optimize the ON time for footswitch 54. Like headswitch 42, footswitch 54 of FIG. 5 is used as vertical, horizontal, and corner switch pad ring cells 30, 32, 34, and therefore may have different cell sizes on the order of those described with reference to the example of FIG. 4.

When the standard cells used to implement hard macro 36 have floating substrate connections, footswitch 54 and hard macro core 36 may share the same substrate connection. As a result, the P-well substrate of hard macro core 36 is connected to VSSX 52. If the standard cells used to implement hard macro core 36 have local substrate connections, the hard macro core and footswitch 54 may share the same connectivity for the P-well substrate. Such an implementation typically may require an extra DN-well layer. As in the example of FIG. 4, feedthrough cell 46 may have a power pin, referred to as VDDX, which is electrically connected to external power ring 38.

During a low power or stand-by mode, signal EN 44 is de-asserted to cause footswitch 40 to turn off and thereby disconnect LVT logic gates within hard macro 36 from ground VSSX 52. Because footswitch 54 has a high threshold voltage, the amount of leakage current drawn from VDDX 48 is thereby reduced. Conversely, during an active mode, the signal EN at gate input 44 is asserted to cause footswitch 54 to turn on and thereby supply (both) VSS_INT 50 (and VDDX 48) to hard macro core 36. In this case, during an active mode, hard macro core 36 is powered by substantially the same voltage as if hard macro core 36 was directly connected between VDDX 48 and VSSX 52.

As in the example of FIG. 4, EN 44 in FIG. 5 may be ramped up over time so as not to substantially affect other hard macros that may be running off of the same power supply as VDDX 48. In addition, the circuitry of FIG. 5 may be designed to facilitate efficient power up in a warm boot after a power collapse is optimized.

Figure 6:
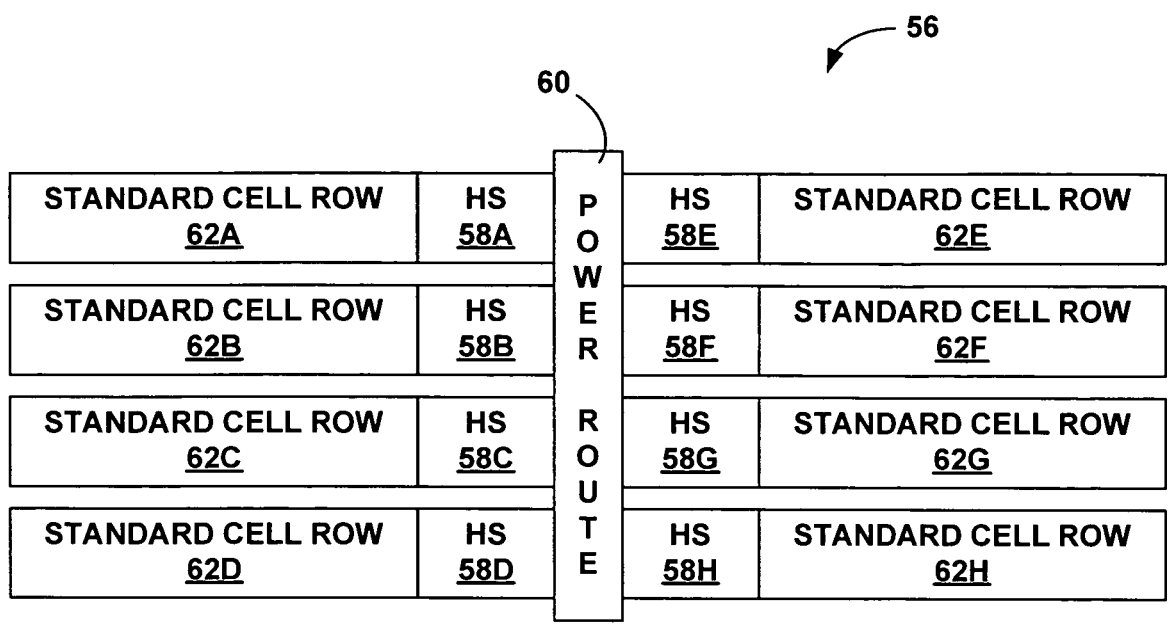
FIG. 6 is a layout diagram illustrating distribution of headswitches under metal 2 (M2) power routes in an integrated circuit.

FIG. 6 is a layout diagram illustrating a portion of an integrated circuit 56 featuring distribution of headswitch (HS) cells 58A-58D (collectively 58) in a striped pattern below metal 2 (M2) power routes 60 in the circuit. In general, each headswitch cell 58 is electrically coupled between the power routes 60 and a respective standard cell row 62A-62H (collectively 62).

In the example of FIG. 3, headswitches are incorporated in a switch pad ring surrounding a hard macro of an integrated circuit such as an ASIC. According to the alternative implementation of FIG. 6, however, headswitch cells 58 are distributed among the rows 62 of standard logic cells defined by the hard macro core of integrated circuit 56. In particular, headswitch cells 58 are embedded below the metal 2 layer that provides the power and ground routing to standard logic cell rows 62.

The embedded headswitch cells 58 provide global power management for LVT logic gates within integrated circuit 56 while achieving efficient use of area and facilitating the use of EDA tools. Each headswitch cell 58 may have the source connected to the power route 60 and the drain connected to the local voltage terminals of the logic cells within each standard cell row 62. In this manner, headswitch cells 58 control the application of the supply voltage provided by power route 60 to the individual logic cells.

Figure 7:
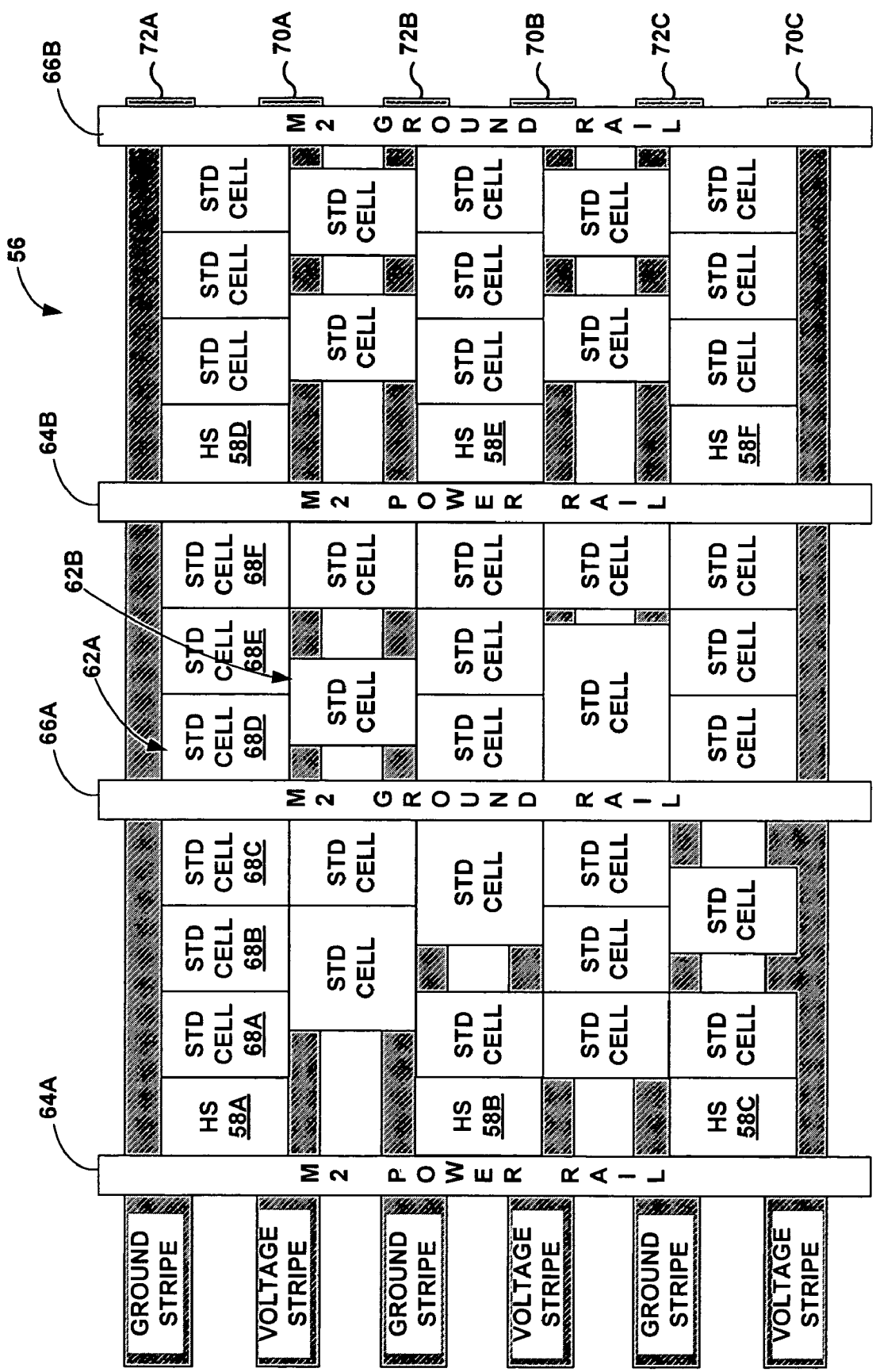
FIG. 7 is a layout diagram illustrating the distributed pattern of headswitches of FIG. 6 in greater detail.

FIG. 7 is a layout diagram illustrating the distributed pattern of headswitches 58 of FIG. 6 in greater detail. As shown in FIG. 7, the metal 2 (M2) layer of integrated circuit 56 includes M2 power rails 64A, 64B (collectively 64), which distribute a supply voltage across the integrated circuit area, and ground rails 66A, 66B (collectively 66), which distribute a ground potential across the integrated circuit area. Headswitch cells 58A-58F stand between global power rails 64 and the standard cell rows with the local power rail on top of the standard cell row, however, to control the distribution of power to the standard cells.

Each headswitch 58 powers one or more rows 60 of standard cells 68A-68F (collectively 68) via a respective voltage stripe 70A-70C (collectively 70) and ground stripe 72A-72C (collectively 72). Headswitch 58A is coupled to a first row 60A of logic cells 68 and a second row 60B of cells 68 via a common voltage stripe 70A, which provides a supply voltage to both rows. A ground stripe 72A is coupled to cells 68 in first row 60A, whereas a ground stripe 72B is coupled to cells in second row 60B.

In the example of FIG. 7, ground stripes 72A, 72B, and 72C are electrically connected to M2 ground rails 66A and 66B to thereby distribute the ground potential among the cells 68 within ASIC 56. However, voltage stripes 70A, 70B, 70C are not directly coupled to M2 power rails 64A, 64B. Instead, headswitches 58A, 58B and 58C connect voltage stripes 70A, 70B, 70C, respectively, to M2 power rail 64A. Headswitches 58D, 58E, 58F connect voltage stripes 70A, 70B, 70C, respectively, to M2 power rail 64B.

Headswitch 58A opens and closes in response to an enable signal to selectively connect and cut off the supply voltage from M2 power rail 64A to standard cells 68 in rows 68A and 68B. In this manner, headswitches 58 aid in power management of the core area of integrated circuit 56 by reducing the amount of leakage current drawn from the supply voltage provided by the M2 power rails 64.

Distributing headswitches 58 below M2 power rails 64 may have particular advantage in electronic devices with an inactive mode in which part of ASIC 56 must continue to operate while other circuits within the ASIC are turned off or are in a low power state. In particular, distributed headswitches 58 can be individually controlled to decouple the supply voltage from selected regions, blocks or rows of ASIC 56. An example is a mobile telephone in which DSP functions are rendered inactive while call detection circuitry remains active.

As manufacturing technology evolves to a higher level of integration and the minimum manufacturable feature becomes smaller and smaller, e.g., 90 nm, 65 nm or 45 nm and lower, going to nanotechnology level, the need for self aware local power management blocks should become much more important. Gate leakage and sub-threshold leakage will become sufficiently dominant that the distributed headswitch/footswitch blocks combined with power sensing control blocks will be desirable to support local self aware sleep mode state isolation of different regions of standard cells from the global power mesh.

In some embodiments, footswitches may be used in place of, or in combination with, headswitches 58 with little or no effect to core area within integrated circuit 56. In such embodiments, footswitches are distributed below M2 ground routes 55, and are connected to ground stripes 72. Headswitches and footswitches distributed below power rails 64 and ground rails 66, as shown in FIG. 7, may be similar in structure to those headswitches and footswitches depicted in FIGS. 4 and 5.

A headswitch or footswitch implementation as described herein may be used with integrated circuit such as an ASIC or a functional component of an ASIC. The ASIC may reside within or be configured for a battery operated portable electronic device such as a mobile telephone, PDA, or other such device. The core area of the ASIC may be represented as a hardened circuit design of LVT logic gates, i.e., a hard macro, which can be re-used in different larger circuit designs. Headswitches 58 form part of the core and are therefore susceptible to design and simulation using EDA tools. In this case, EDA tools can automatically place and route headswitches or footswitches under the M2 power routes in areas generally unused in an ASIC.

Some of the area below M2 power routes 54 is generally unused in many ASIC designs. Consequently, distribution of headswitches 58 as shown in FIGS. 6 and 7 consumes area that may not otherwise be used, thereby providing more efficient use of the core area of integrated circuit 56. When headswitches or footswitches are distributed under power rails 64 and ground rails 66 in areas which are typically unused, as described herein, the implementations may be particularly useful for core areas of an ASIC that comprise DSP, decoder, or other hardened IP core circuitry that is not dense. Conversely, the headswitch or footswitch implementation may be less desirable for SRAM, DRAM, embedded flash memory, and other dense circuitry that may not typically include unused area under the M2 power rails 64 and ground rails 66.

The use of standard logic cells 68 in integrated circuit 56 of FIG. 7 can support an efficient top-down design methodology and present local substrate connections. In embodiments with footswitches distributed under M2 ground routes 64, standard cells 58 may have floating substrate ties. Voltage stripes 70 and ground stripes 72 provide signals VDDX and VSSX, respectively, to the exemplary headswitch cells and feedthrough cells. The power pins of headswitches 58 are electrically connected to M2 power rails 64 while, in other embodiments, footswitches are electrically connected to M2 ground rails 66.

No additional power routing is required inside the core area of integrated circuit 56. Additionally, as described previously, a special feedthrough cell may be electrically connected to the headswitches or footswitches and placed in the standard cell row. In this case, the SVDDX pin is routed to the M2 power rail 64 and ground rail 66. The widths of power rail 64 and ground rail 66 may vary, e.g., approximately 3 microns, 6 microns, or 12 microns. In each cease, the size of each headswitch 58 or footswitch is proportional to the width of the power rail 64 or ground rail 66, respectively.

Figure 8:
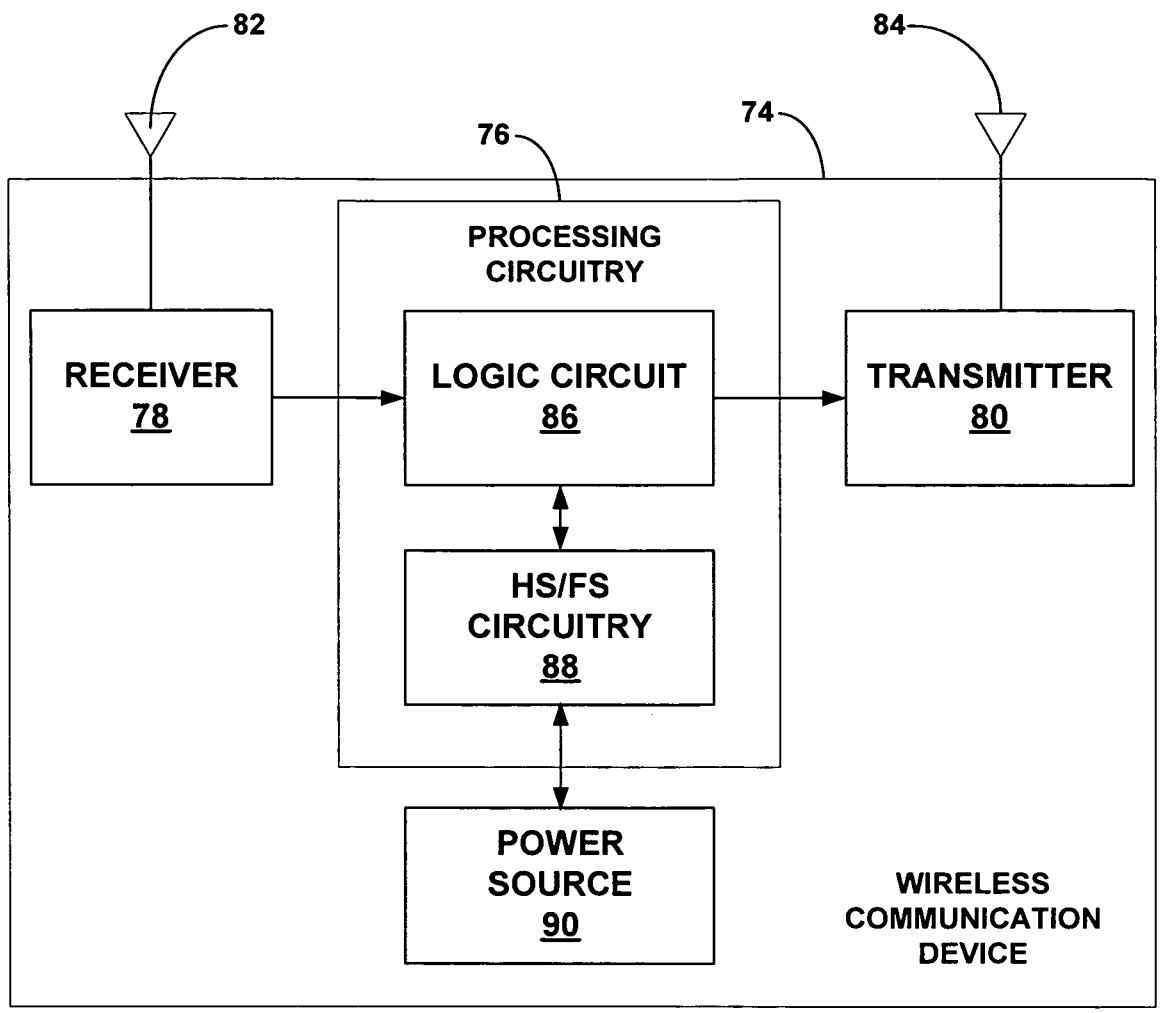
FIG. 8 is a block diagram illustrating an electronic device incorporating a logic circuit as described in this disclosure.

FIG. 8 is a block diagram illustrating an electronic device incorporating a logic circuit as described in this disclosure. In the example of FIG. 8, the electronic device is a wireless communication device 74 such as a mobile telephone. As shown in FIG. 8, wireless communication device 74 includes processing circuitry 76, a receiver 78 and a transmitter 80. Receiver 78 receives wireless signals via antenna 82, and transmitter 80 transmits wireless signals via antenna 84. In some embodiments, receiver 78 and transmitter 80 may use a common antenna.

Processing circuitry 86 include one or more logic circuits 86 to drive transmitter 80 and process signals received by receiver 78. Hence, processing circuitry 86 may incorporate typical wireless modem functionality, and may also be equipped to control various functions within wireless communication device 74, such as user interface functions. Headswitch or footswitch circuitry 88 selectively connects logic cells within logic circuit 86 to an external power source 90, such as a battery and appropriate power conversion circuitry.

As described in this disclosure, headswitch or footswitch circuitry 88 connects the logic cells to an external power terminal or an external ground reference in order to place the logic cells in active or inactive modes on a selective basis. Headswitch or footswitch circuitry 88 may incorporate a pad ring switch cell arrangement or a distributed switch cell arrangement, in accordance with any of the embodiments described in this disclosure.

This disclosure presents different global headswitch and footswitch implementations for power management of an integrated circuit such as an ASIC while making efficient use of area and EDA tools. An ASIC may include a DSP, decoder, memory block, custom core or any other IP hardened core and may be independent or integrated with an SOC in any of a variety of electronic devices, including small, portable devices such as mobile telephones, PDAs and the like. These and other embodiments are within the scope of the following claims.

The invention claimed is:

1. An integrated circuit comprising:
   a logic circuit including a plurality of logic cells, the logic circuit being defined as a hard core;
   a pad ring placed around the logic circuit;
   an external terminal to provide a first supply potential;
   an internal terminal to provide a second supply potential; and
   a plurality of switch cells within the pad ring, each of the switch cells electrically coupling the external terminal to the internal terminal to selectively apply the second supply potential to the logic cells within the logic circuit, the switch cells being defined within an electronic design automation (EDA) boundary of the hard core.

2. The integrated circuit of claim 1, wherein the switch cells include vertical, horizontal, and corner switch cells placed around the logic circuit.

3. The integrated circuit of claim 1, wherein the switch cells include headswitches, the external terminal is an external power terminal, the first supply potential is a first supply voltage, the internal terminal is an internal power terminal, and the second supply potential is a second supply voltage.

4. The integrated circuit of claim 3, wherein each of the logic cells is coupled to the internal power terminal via one of the headswitches and to a ground terminal.

5. The integrated circuit of claim 1, wherein the switch cells include footswitches, the external terminal is an external ground terminal, the first supply potential is a first ground potential, the internal terminal is an internal ground terminal, and the second supply potential is the first ground potential.

6. The integrated circuit of claim 5, wherein each of the logic cells is coupled to the internal ground terminal via one of the footswitches.

7. The integrated circuit of claim 1, wherein at least some of the logic cells include low voltage threshold logic gates and the switch cells include high voltage threshold switches.

8. The integrated circuit of claim 1, wherein the external terminal includes an external power ring that extends around the pad ring, and the internal terminal includes an internal power ring that extends around the logic circuit.

9. The integrated circuit of claim 8, wherein the pad ring is disposed substantially between the internal power ring and the external power ring.

10. The integrated circuit of claim 1, further comprising a plurality of feedthrough cells, each of the feedthrough cells driving one of the switch cells in response to an enable signal.

11. The integrated circuit of claim 10, wherein each of the feedthrough cells includes a power terminal coupled to the external terminal.

12. The integrated circuit of claim 11, wherein each of the feedthrough cells includes a power terminal coupled to the internal terminal.

13. The integrated circuit of claim 10, wherein the feedthrough cells reside within the logic circuit.

14. The integrated circuit of claim 10, wherein each of the feedthrough cells resides within the hard core.

15. The integrated circuit of claim 10, wherein the feedthrough cells drive the switch cells to selectively couple and decouple the external terminal relative to the internal terminal and thereby place the logic cells in active and inactive states.

16. The integrated circuit of claim 1, wherein the logic cells are arranged to define digital processing circuitry and memory.

17. The integrated circuit of claim 1, wherein the pad ring includes one or more decoupling capacitor cells among the switch cells.

18. The integrated circuit of claim 1, wherein the integrated circuit is an ASIC.

19. An integrated circuit comprising:
a logic circuit including a plurality of logic cells;
a metal layer including a metal layer power rail disposed adjacent the logic cells and a metal layer ground rail disposed adjacent the logic cells; and
a plurality of switch cells under the metal layer, each of the switch cells selectively coupling and decoupling one of the power rail and the ground rail to power at least some of the logic cells;
wherein the logic circuit is defined as a hard core and the switch cells are defined within an electronic design automation (EDA) boundary of the hard core.

20. The integrated circuit of claim 19, wherein each of the switch cells includes a headswitch to connect and disconnect the power rail to and from the logic cells.

21. The integrated circuit of claim 19, wherein each of the switch cells includes a footswitch to connect and disconnect the ground rail to and from the logic cells.

22. The integrated circuit of claim 19, further comprising a plurality of distribution stripes, each of the distribution stripes being coupled to one of a plurality of groups of the logic cells, wherein each of the switch cells couples one of the power rail and the ground rail to one of the distribution stripes to power one of the groups of the logic cells.

23. The integrated circuit of claim 19, wherein the power rail is coupled to an external power supply, and the ground rail is coupled to an external ground potential.

24. The integrated circuit of claim 19, wherein each of the switch cells includes a headswitch, and each of the logic cells is connected to the power rail via one of the headswitches and to the ground rail.

25. The integrated circuit of claim 19, wherein each of the switch cells includes a footswitch, and each of the logic cells is connected to the ground rail via one of the footswitches and to the power rail.

26. The integrated circuit of claim 19, wherein at least some of the logic cells include low voltage threshold logic gates and the switch cells include high voltage threshold switches.

27. An integrated circuit comprising:
a logic circuit including a plurality of logic cells;
a metal layer including a metal layer power rail disposed adjacent the logic cells and a metal layer ground rail disposed adjacent the logic cells;
a plurality of switch cells under the metal layer, each of the switch cells selectively coupling and decoupling one of the power rail and the ground rail to power at least some of the logic cells; and
a plurality of feedthrough cells, each of the feedthrough cells driving one of the switch cells in response to an enable signal.

28. The integrated circuit of claim 27, wherein each of the feedthrough cells includes a power terminal connected to an external power supply.

29. The integrated circuit of claim 28, wherein each of the feedthrough cells includes a power terminal connected to the power rail.

30. The integrated circuit of claim 27, wherein the feedthrough cells reside within the logic circuit or under global power routing stripes.

31. The integrated circuit of claim 27, wherein the logic circuit is defined as an electronic design automation (EDA) hard core, and each of the feedthrough cells resides within the hard core.

32. The integrated circuit of claim 27, wherein the feedthrough cells drive the switch cells to selectively couple and decouple an external terminal relative to an internal terminal and thereby place the logic cells in active and inactive states.

33. The integrated circuit of claim 19, wherein the logic cells are arranged to define digital processing circuitry and memory.

34. A wireless communication device comprising:
a wireless transmitter;
a wireless receiver; and
a processing circuit to drive the transmitter and process signals received by the wireless receiver, the processing circuit including a logic circuit defined as a hard core and having a plurality of logic cells, a pad ring placed around the logic circuit, an external terminal to provide a first supply potential, an internal terminal to provide a second supply potential, and a plurality of switch cells within the pad ring, each of the switch cells electrically coupling the external terminal to the internal terminal to selectively apply the second supply potential to the logic cells within the logic circuit, and the switch cells being defined within an electronic design automation (EDA) boundary of the hard core.

35. The wireless communication device of claim 34, wherein the switch cells include vertical, horizontal, and corner switch cells placed around the logic circuit.

36. The wireless communication device of claim 34, wherein the switch cells include headswitches, the external terminal is an external power terminal, the first supply potential is a first supply voltage, the internal terminal is an internal power terminal, and the second supply potential is a second supply voltage, and wherein each of the logic cells is coupled to the internal power terminal via one of the headswitches and to a ground terminal.

37. The wireless communication device claim 34, wherein the switch cells include footswitches, the external terminal is an external ground terminal, the first supply potential is a first ground potential, the internal terminal is an internal ground terminal, and the second supply potential is a second ground potential, and wherein each of the logic cells is coupled to the internal ground terminal via one of the footswitches.

38. A wireless communication device comprising:
a wireless transmitter;
a wireless receiver; and
a processing circuit to drive the transmitter and process signals received by the wireless receiver, the processing circuit including a plurality of logic cells, a metal layer including a metal layer power rail disposed under the logic cells and a metal layer ground rail disposed under the logic cells, and a plurality of switch cells under the metal layer, each of the switch cells selectively coupling and decoupling one of the power rail and the ground rail to power at least some of the logic cells;
wherein the processing circuit comprises a logic circuit defined as a hard core, and the switch cells are defined within an electronic design automation (EDA) boundary of the hard core.

39. The wireless communication device of claim 38, wherein each of the switch cells includes a headswitch to couple and decouple the power rail to the logic cells.

40. The wireless communication device of claim 38, wherein each of the switch cells includes a footswitch to couple and decouple the ground rail to the logic cells.

41. A wireless communication device comprising:
a wireless transmitter;
a wireless receiver;
a processing circuit to drive the transmitter and process signals received by the wireless receiver, the processing circuit including a plurality of logic cells, a metal layer including a metal layer power rail disposed under the logic cells and a metal layer ground rail disposed under the logic cells, and a plurality of switch cells under the metal layer, each of the switch cells selectively coupling and decoupling one of the power rail and the ground rail to power at least some of the logic cells; and
a plurality of distribution stripes, each of the distribution stripes being coupled to one of a plurality of groups of the logic cells, wherein each of the switch cells couples one of the power rail and the ground rail to one of the distribution stripes to power one of the groups of the logic cells.

42. The wireless communication device of claim 41, wherein each of the switch cells includes a switch having a first power pin electrically coupled to the power rail and a second power pin electrically connected to one of the distribution stripes.

43. An integrated circuit comprising:
a logic circuit including a plurality of logic cells;
a pad ring placed around the logic circuit;
an external terminal to provide a first supply potential;
an internal terminal to provide a second supply potential;
a plurality of switch cells within the pad ring, each of the switch cells electrically coupling the external terminal to the internal terminal to selectively apply the second supply potential to the logic cells within the logic circuit; and
a plurality of feedthrough cells, each of the feedthrough cells driving one of the switch cells in response to an enable signal.

44. An integrated circuit comprising:
a logic circuit including a plurality of logic cells;
a pad ring placed around the logic circuit;
an external terminal to provide a first supply potential;
an internal terminal to provide a second supply potential;
a plurality of switch cells within the pad ring, each of the switch cells electrically coupling the external terminal to the internal terminal to selectively apply the second supply potential to the logic cells within the logic circuit; and
one or more decoupling capacitor cells among the switch cells within the pad ring.

45. A wireless communication device comprising:
a wireless transmitter;
a wireless receiver; and
a processing circuit to drive the transmitter and process signals received by the wireless receiver, the processing circuit including a logic circuit having a plurality of logic cells, a pad ring placed around the logic circuit, an external terminal to provide a first supply potential, an internal terminal to provide a second supply potential, and a plurality of switch cells within the pad ring, each of the switch cells electrically coupling the external terminal to the internal terminal to selectively apply the second supply potential to the logic cells within the logic circuit and a plurality of feedthrough cells, each of the feedthrough cells driving one of the switch cells in response to an enable signal.

46. A wireless communication device comprising:
a wireless transmitter;
a wireless receiver; and
a processing circuit to drive the transmitter and process signals received by the wireless receiver, the processing circuit including a logic circuit having a plurality of logic cells, a pad ring placed around the logic circuit, an external terminal to provide a first supply potential, an internal terminal to provide a second supply potential, a plurality of switch cells within the pad ring, and one or more decoupling capacitor cells among the switch cells within the pad ring, each of the switch cells electrically coupling the external terminal to the internal terminal to selectively apply the second supply potential to the logic cells within the logic circuit.

* * * * *